United States Patent
Park et al.

[11] Patent Number: 6,037,198
[45] Date of Patent: Mar. 14, 2000

[54] METHOD OF FABRICATING SOI WAFER

[75] Inventors: Kyoung Wan Park, Daejeon; Seong Jae Lee, Seoul; Moon Ho Park, Daejeon; Min Cheol Shin, Daejeon; Sang Chul Oh, Daejeon, all of Rep. of Korea

[73] Assignee: Electronics and Telecommunications Research Institute, Daejeon, Rep. of Korea

[21] Appl. No.: 09/139,651

[22] Filed: Aug. 25, 1998

[30] Foreign Application Priority Data

Dec. 1, 1997 [KR] Rep. of Korea .................. 97-65066

[51] Int. Cl.[7] ..................................... H01C 71/00
[52] U.S. Cl. .................... 438/151; 438/152; 438/459
[58] Field of Search .................... 438/149, 151, 438/152, 459, 479

[56] References Cited

U.S. PATENT DOCUMENTS

| | | | |
|---|---|---|---|
| 5,385,863 | 1/1995 | Tatsumi et al. | 437/109 |
| 5,393,370 | 2/1995 | Ohta et al. | |
| 5,478,408 | 12/1995 | Mitani et al. | |
| 5,623,243 | 4/1997 | Watanabe et al. | 257/309 |
| 5,658,809 | 8/1997 | Nakashima et al. | |
| 5,723,379 | 3/1998 | Watanabe et al. | 438/398 |
| 5,869,387 | 2/1999 | Sato et al. | 438/459 |

OTHER PUBLICATIONS

Wolf, Stanley, "Silicon Processing For the VLSI Era: vol. 1: Process Technology", Lattice Press, pp. 207–219, 1986.

Jingbao Liu et al., "Formation of buried oxide in silicon using separation plasma implantation of oxygen", Appl. Phys. Lett. 67 (16), Oct. 16, 1995, 1995 American Institute of Physics, pp. 2361–2363.

*Primary Examiner*—John F. Niebling
*Assistant Examiner*—Michael S. Lebentritt
*Attorney, Agent, or Firm*—Jacobson, Price, Holman & Stern, PLLC

[57] ABSTRACT

The present invention is to fabricate SOI wafer whose the silicon layer is very uniform and the impurity concentration is low. The insulating layer, that is, a composite layer of $SiO_2$ and silicon, is grown on oxide substrate by means of a molecular beam epitaxy fabricating method using silicon as an original material in the oxygen atmosphere. The composite layer of the oxide and silicon is grown according to gradual decreasing the pressure of oxygen atmosphere. A top silicon layer of uniform thickness is grown by means of a molecular beam epitaxy fabricating method using only silicon material consecutively on the composite layer.

2 Claims, 2 Drawing Sheets

METHOD OF FABRICATING SOI WAFER

BACKGROUND OF THE INVENTION

1. Field of the Invention

The present invention relates to a method of fabricating SOI (Silicon on Insulator) wafer and, more particularly, to a method of fabricating SOI wafer whose silicon layer formed on insulator has uniform thickness and low impurity concentration.

2. Description of the Prior Art

Two techniques are known as a method of fabricating SOI wafer by a conventional art. One is SIMOX (Separated by Implanted Oxygen) technique, another is a face to face attaching technique of two silicon substrates whose oxide film is formed on the surface thereof.

Recently, silicon wafer is widely used as the material for fabricating semiconductor electronic devices. There are a lot of electronic devices such as memory devices and integrated circuit devices using the silicon single crystal wafers. These electronic devices are such that a partial electrical insulation is necessary in their fabrication process. However, the silicon doesn't have the insulating characteristics in material properties. Thus, the PN junction of silicon substrate is used for the respective partial insulation in the silicon semiconductor process for fabricating the electronic device.

Since the SOI structure has been recently expected to solve the problem of insulation, the SOI wafer has been developed as a substrate for the next generation electronic device. The SOI wafer can solve the problems such as the parasitic electrostatic capacitance and incomplete insulation between individual devices that the prior silicon substrate faces in integration of the electronic devices.

The SIMOX technique is to fabricate SOI substrate by means of generating a buried nonconducting layer of $SiO_2$ inside of the pure silicon wafer. After the oxygen ions of high energy are implanted in the certain depth from the surface of the silicon wafer, and then the implanted oxygen atoms and the silicon atoms inside of the wafer are reacted together through the heat treatment to be transformed into $SiO_2$.

However, there are shortcomings because a large area silicon wafer is used in the oxygen ion implantation process. It is difficult to control uniformly the thickness of the surface silicon and the generated $SiO_2$ layer. Furthermore, the concentration of impurities such as point defects is high in the surface silicon layer because of using the oxygen ion of high energy.

The another technique for fabricating SOI substrate is to form $SiO_2$ layer on the surface of a silicon wafer by the oxidation process, attach face to face the $SiO_2$ layers of these two oxidized silicon wafers, and remove certain amount of the silicon in one side of wafer. However, since the silicon removal process of the large area is necessary in this fabrication process, it is difficult to uniformly control the thickness of silicon left.

That is, the thickness of silicon remained as the active layer in such SOI wafers must be very uniform and the concentration of impurities must be low. However, it is difficult to fabricate a silicon layer whose thickness is uniform and impurity concentration is low by the prior arts.

SUMMARY OF THE INVENTION

It is an object of the present invention to provide a method of fabricating SOI wafers having uniform thickness and low impurity of a silicon layer.

In order to accomplish the above object, the method comprises steps of (a) forming a composite layer of $SiO_2$ and silicon on a base insulating substrate and (b) forming a silicon layer on the composite layer of $SiO_2$ and silicon.

The present invention is to grow the composite layer of $SiO_2$ and silicon on the base insulating substrate using the silicon molecular beam epitaxy apparatus in the oxygen atmosphere, and then grow a silicon layer of a good quality in the ultrahigh vacuum. By growing the interfacial composite layer of $SiO_2$ and silicon between the top layer silicon and the base insulator, the interfacial defect density decreases.

The present invention alleviates the number of defects occurred in the interface of the composite layer and the top silicon layer upon forming the top silicon layer on the interfacial composite layer.

The main part of the present invention is to grow the composite interfacial layer of $SiO_2$ and silicon whose ratio of $SiO_2$ gradually decreases and the ratio of silicon gradually increases at the same time before the growth of the top layer silicon. The smooth change of the ratio can be achieved by gradual change of the oxygen pressure in the molecular beam epitaxy apparatus using the silicon as an original material.

BRIEF DESCRIPTION OF THE DRAWINGS

The above objects and features of the present invention will become apparent in the following description of preferred embodiments, in which.

DETAILED DESCRIPTION OF THE PREFERRED EMBODIMENTS

Hereinafter, the embodiment of the present invention will be in detail explained with reference to the attached drawings.

Figure 1:
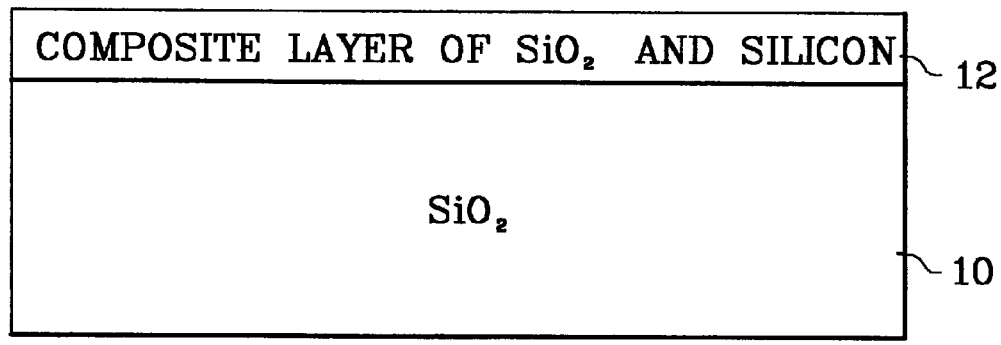
FIG. 1 is a sectional view of composite layer of silicon oxide and silicon according to uniform growth of an oxide by means of a molecular beam epitaxy fabricating method using a silicon as an original material in the oxygen atmosphere and gradual decrease of the pressure of oxygen atmosphere in the growth of the oxide.
Figure 2:
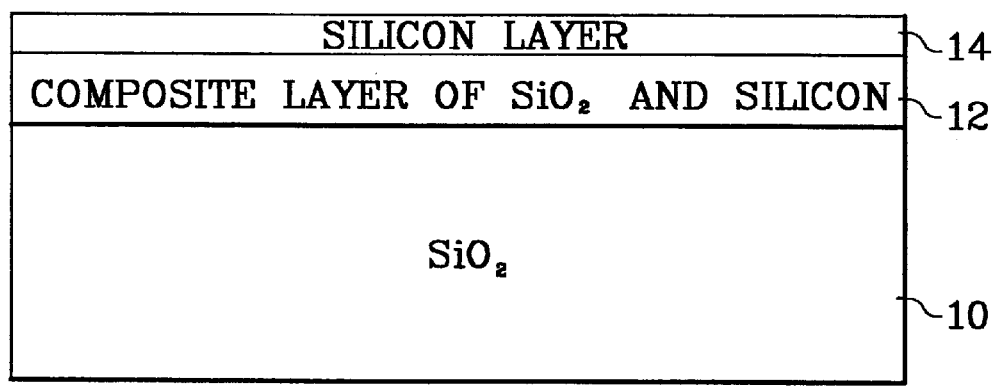
FIG. 2 is a sectional view of SOI substrate in which a top silicon layer is formed by means of a molecular beam epitaxy fabricating method on the composite layer of $SiO_2$ and silicon.

FIG. 1 and FIG. 2 are sectional views of the SOI substrate fabricated in accordance with the present invention.

As shown in FIG. 1, in the process of fabricating SOI substrate according to the present invention, a smooth glass substrate 10 is loaded in the reactor of the molecular epitaxy apparatus using pure silicon as an original material.

Figure 3:
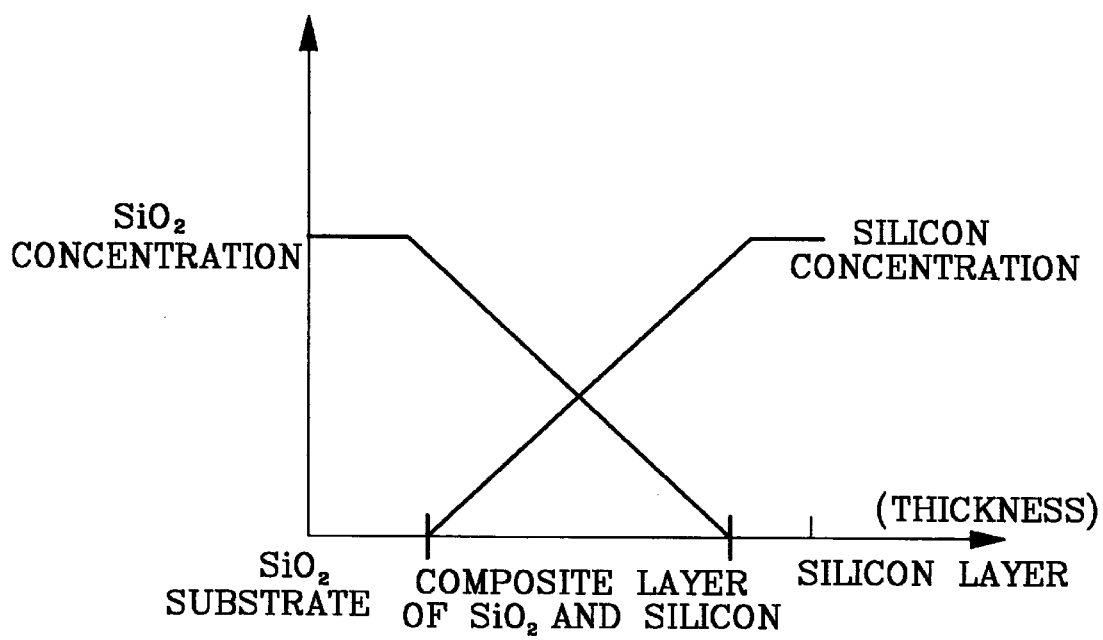
FIG. 3 is a graph showing a change of composition ratio of the $SiO_2$ molecule and silicon atom along the thickness of SOI substrate of FIG. 2.

Then, $SiO_2$ is grown upon maintaining the interior of the reactor in the oxygen atmosphere of the pressure region of 10-5~10-6 Torr. As the oxygen pressure is gradually decreased, the growth of $SiO_2$ is gradually prohibited and the growth of silicon is increased. As a result, there are formed the composite layer 12 of $SiO_2$ and silicon on the glass substrate 10, whose relative ratio is demonstrated in FIG. 3.

Figure 4:
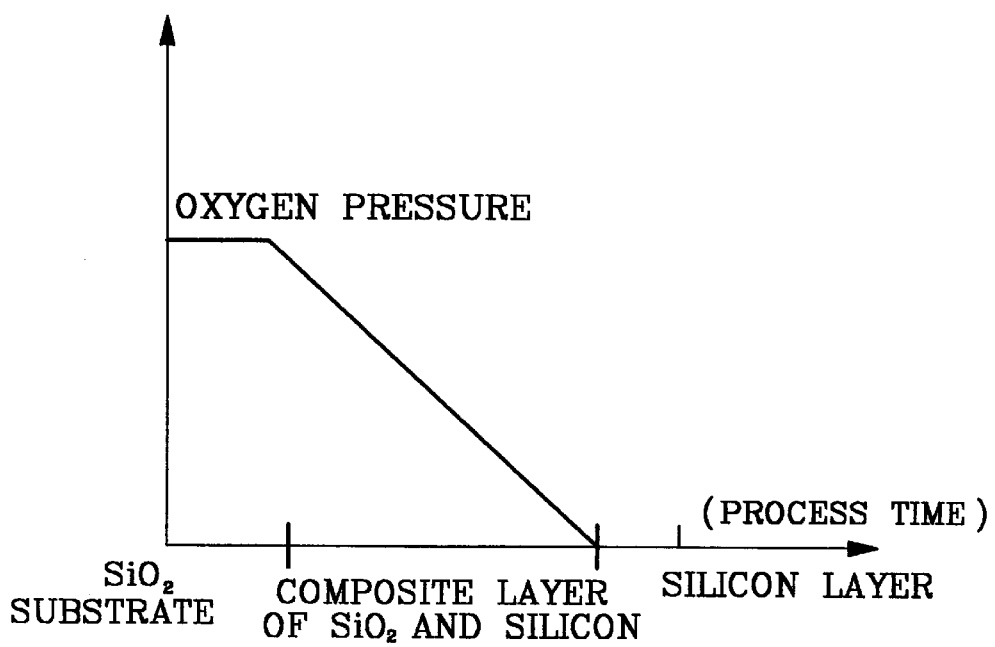
FIG. 4 is a graph showing a change of an oxygen pressure depending on the time lapse of manufacturing SOI substrate according to the present invention.

At this time, the growth thickness of the SiO2 and silicon composite layer 12 is decided according to the growth time, the substrate temperature, the intensity of the silicon molecular beam, and the oxygen pressure. The change rate of the oxygen pressure is shown in FIG. 4 during the growth of the composite layer.

After forming the composite layer 12 of SiO2 and silicon on the glass substrate 10, as shown in FIG. 1, the pressure in the reactor is maintained in the ultrahigh vacuum state without oxygen, then the top silicon layer 14 is formed, which is shown in FIG. 2.

By growing the interfacial composite layer 12 of SiO2 and silicon between the top silicon layer 14 and the base insulator 10, the interfacial defect density decreases. As a result, the present invention alleviates the number of defects occurred in the interface of the composite layer and the top silicon layer upon forming the top silicon layer on the interfacial composite layer.

In the method of fabricating SOI substrate according to the present invention, a composite layer and a top silicon layer are consecutively formed according as the pressure of oxygen decreases in the molecular beam single crystal growth apparatus, so uniform silicon layer of low impurity concentration can be finally formed.

As described above, although the present invention has been described in detail with reference to illustrative embodiments, the invention is not limited thereto and various modifications and changes may be effected by one skilled in the art within the scope of the invention.

What is claimed is:

1. A method of fabricating SOI substrate, said method comprises steps of:

forming a composite layer of SiO2 and silicon on a glass substrate according as an oxygen pressure gradually decreases in an oxygen atmosphere by means of a molecular beam epitaxy apparatus using the silicon as an original material;

forming a silicon layer without oxygen pressure in an ultrahigh vacuum state on said composite layer of SiO2 and silicon.

2. The method of fabricating SOI substrate according to claim 1, wherein said composite layer of SiO2 and silicon is formed as insulator.

\* \* \* \* \*